(12) United States Patent
Yoo

(10) Patent No.: US 6,400,620 B1
(45) Date of Patent: Jun. 4, 2002

(54) SEMICONDUCTOR MEMORY DEVICE WITH BURN-IN TEST FUNCTION

(75) Inventor: Jei-Hwan Yoo, Kyunggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/900,728

(22) Filed: Jul. 6, 2001

(30) Foreign Application Priority Data

Jan. 31, 2001 (KR) .......................................... 2001-4586

(51) Int. Cl.$^7$ ............................................... G11C 29/00
(52) U.S. Cl. ...................... 365/200; 365/201; 365/225.7
(58) Field of Search ................ 365/200, 201, 365/225.7

(56) References Cited

U.S. PATENT DOCUMENTS

| | | | |
|---|---|---|---|
| 5,327,380 A | | 7/1994 | Kersh et al. |
| 5,355,339 A | | 10/1994 | Oh et al. |
| 5,748,543 A | * | 5/1998 | Lee et al. .................... 365/200 |
| 5,973,988 A | | 10/1999 | Nakahira et al. |
| 6,067,268 A | | 5/2000 | Lee |
| 6,094,382 A | | 7/2000 | Choi et al. |
| 6,272,056 B1 | * | 8/2001 | Ooishi ........................ 365/200 |

* cited by examiner

*Primary Examiner*—Huan Hoang
(74) *Attorney, Agent, or Firm*—Marger Johnson & McCollom, P.C.

(57) ABSTRACT

Disclosed is a semiconductor memory device having a master fuse circuit, and an address storage and decoding circuit. The address storage and decoding circuit stores address information to assign a defective main cell of main cells, and receives current address information in response to switch control signals. During a burn-in test mode for the main cells, the master fuse circuit generates the switch control signals in response to a bum-in test signal indicating the bum-in test, for shutting the address information off not to be provided to the address storage and decoding circuit, regardless of a connected state of the master fuse.

7 Claims, 3 Drawing Sheets

SEMICONDUCTOR MEMORY DEVICE WITH BURN-IN TEST FUNCTION

This application relies for priority upon Korean Patent Application No. 2001-4586, filed on Jan. 31, 2001, the contents of which are herein incorporated by reference in their entirety.

FIELD OF THE INVENTION

The present invention generally relates to a semiconductor memory device and, more specifically, to a semiconductor memory device having a redundant circuit for replacing a defective cell with a redundant memory cell.

BACKGROUND OF THE INVENTION

Once semiconductor memory devices are produced, a screening operation is performed to detect and remove defective devices to ensure the overall quality of the devices. In one such screening operation, a bum-in test is executed, which can involve both field acceleration and temperature acceleration. In a bum-in test commonly called a stress test, the device is operated in a state wherein the voltage and temperature are set much higher than the normal operating voltage and temperature of the device. Moreover, a stress voltage higher than that which frequently causes initial failure during normal operation is applied to the device during a short time period. As a result, a device in which a defect may not otherwise exist until the device's initial operation is instead detected beforehand and removed from production. For the purpose of improving the production yield in accordance with increased capacitance and integration of the device, a redundancy scheme in which a redundant memory cell is used as a substitute for a defective cell is utilized. In the redundancy scheme, it is important to maximize redundancy flexibility in order to improve an efficiency of repair, minimizing increase in chip size.

To shorten the time used for the bum-in test operation, it is preferred to increase the time for applying high or low voltage to the entire cells through bit line sense amplifier, which is well known to those skilled in the art. In general, the burn-in test operation is carried out by selecting a number of array blocks more than the number of array blocks selected in the normal operation, activating word lines of the selected array blocks, and applying VCC or 0V to cells connected to the activated word lines. FIG. 1 shows an example of the array blocks selected in the burn-in test operation in which the number of the array blocks is four times than that of the number of array blocks activated in the normal operation. FIG. 2 shows another example that the number of the array blocks selected in the burn-in test operation is eight times than that of the number of array blocks in the normal operation.

If the number of the word lines being activated is increased to shorten the time for the burn-in test operation, a size of the array block where the word lines can be synchronously activated is accordingly decreased. As a result, row redundancy flexibility is decreased. Comparing the array blocks shown in FIG. 2 with that of FIG. 1, the number of the word lines which can be synchronously activated is increased two times, whereby the size of the array blocks is decreased by half. At the same time, the row redundancy flexibility is decreased by half, defined within the size of the decreased blocks.

Consequently, according to the foregoing test scheme, the burn-in testing time can be reduced. However, it also decreases the redundancy flexibility, resulting in degrading the production yield. In order to improve the problems, it is desirable to increase the number of row redundancies, but the chip size is consequently increased.

SUMMARY OF THE INVENTION

It is, therefore, an object of the present invention to provide a semiconductor memory device capable of decreasing the time for burn-in test without decreasing row redundancy flexibility.

In order to attain the above objects, according to an aspect of the present invention, there is provided a semiconductor memory device having a plurality of main cells and a plurality of redundant cells. The device includes an address storage and decoding circuit, and a master fuse circuit. The address storage and decoding circuit stores address information to assign a defective main cell of the main cells, and generates a redundant flag signal when the defective main cell corresponding to the stored address information is assigned by a current address information. The master fuse circuit generates switch control signals in accordance with a connected state of the master fuse storing whether the defective main cell is replaced with the redundant cell. During a burn-in test mode for the main cells, the master fuse circuit generates the switch control signals in response to a burn-in test signal. The switch control signals shut the address information off not to be provided to the address storage and decoding circuit regardless of the connected state of the master fuse.

In the semiconductor memory device according to the present invention, a redundant word line is not assigned when the burn-in test operation is carried out.

According to the semiconductor memory device of the present invention, the time for the burn-in test operation can be reduced by making a lot of word lines synchronously activated in order to give stress on many cells during the burn-in test operation. Further, the production yield can be improved by maximizing row redundancy flexibility to minimize an increase of chip size during the normal operation.

As a result, it is possible to reduce the burn-in test time by maximizing the efficiency of row redundancy, with maximizing the number of the word lines being synchronously activated in the burn-in test operation.

Brief Description of the Drawings

The above and other objects, features and advantages of the present invention will become more apparent from the following detailed description when taken in conjunction with the accompanying drawings in which.

DESCRIPTION OF THE PREFERRED EMBODIMENT

In the following description for purposes of explanation, specific numbers, materials and configurations are set forth in order to provide a thorough understanding of the present invention. However, it will be apparent to one skilled in the art that the present invention may be practiced without the specific without the specific details. In other instances, well known systems are shown in diagrammatic or block diagram form in order not to obscure the present invention.

A master fuse circuit of the invention includes a master fuse to indicate whether or not a repair operation is carried out. An address storage and decoding circuit stores address information corresponding to a defective cell. The address storage and decoding circuit determines whether the stored address information is identical with current address information, and generates a redundant flag signal in response to the determined result. When the redundant flag signal is activated, the redundant memory cell is selected instead of the defective memory cell.

Figure 1:
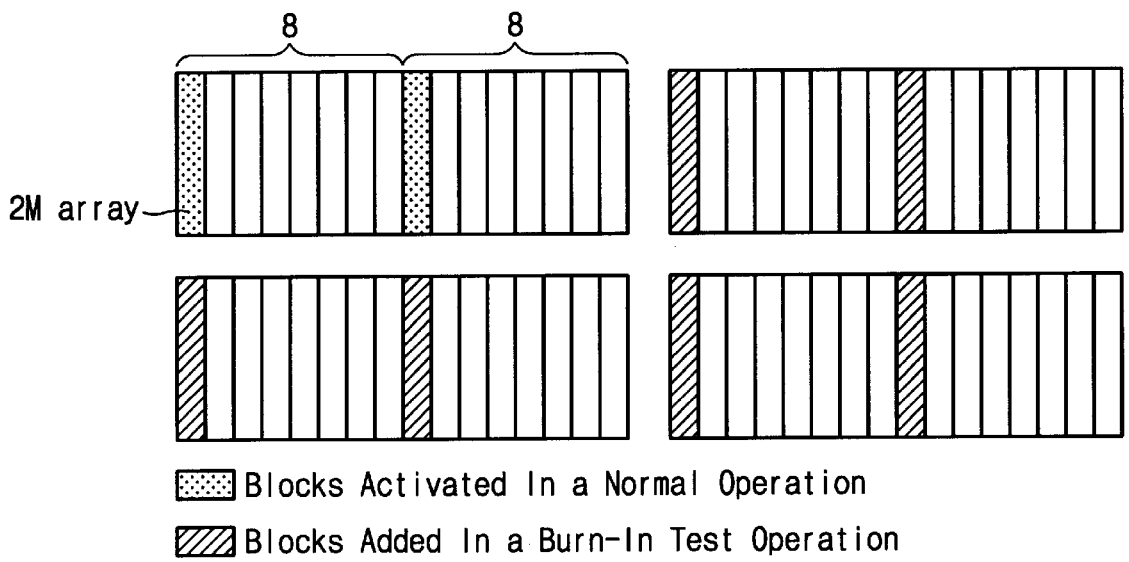
FIGS. 1 and 2 are diagrams showing memory blocks selected in a burn-in test operation according to the conventional art.
Figure 2:
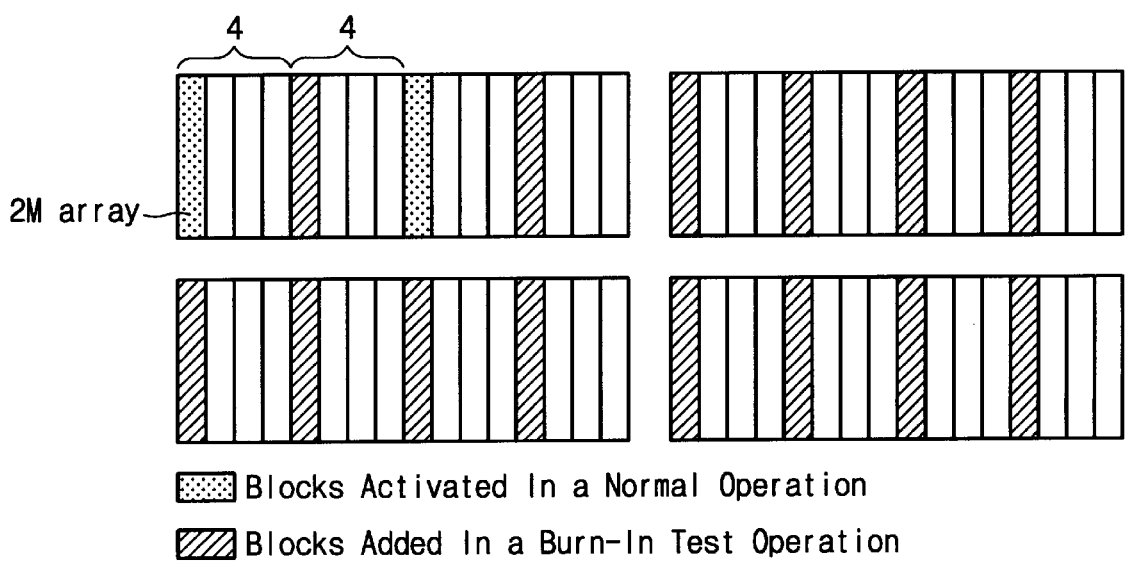
Figure 3:
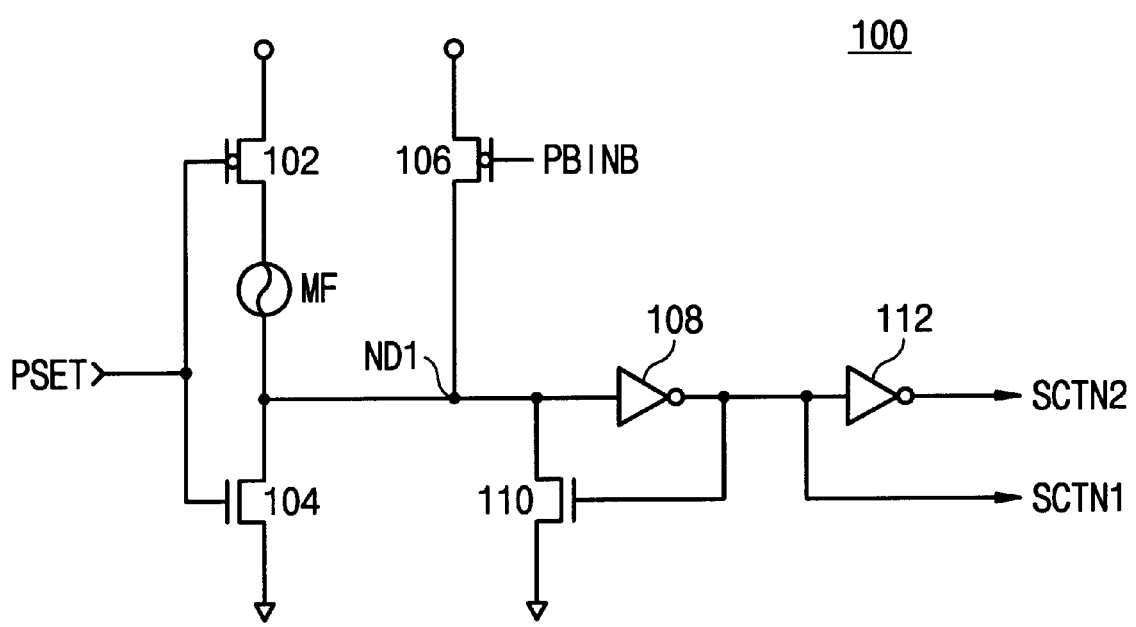
FIG. 3 is a circuit diagram showing a master fuse circuit according to a preferred embodiment of the present invention.
Figure 4:
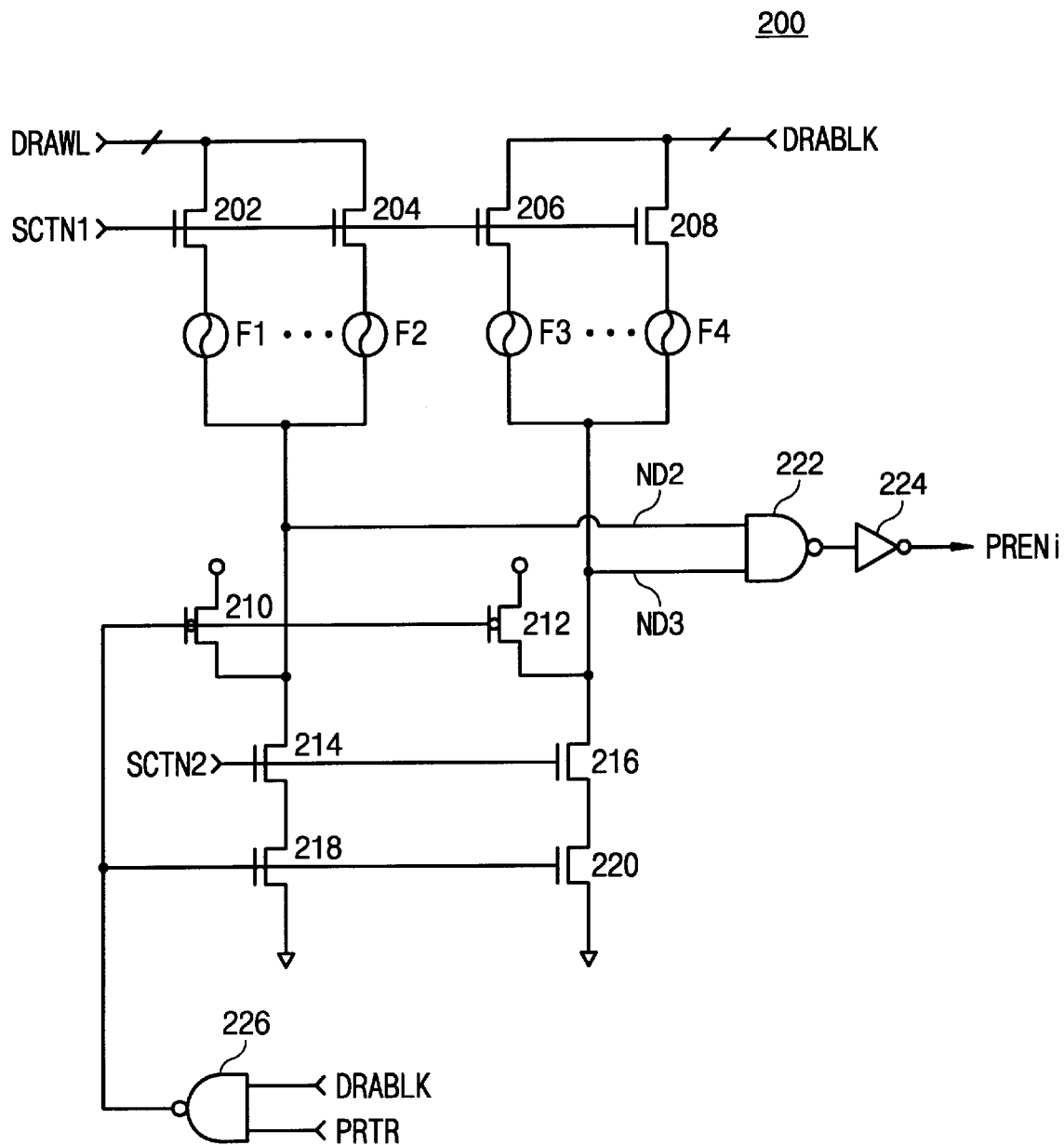
FIG. 4 is a circuit diagram showing a redundant address storage and decoding circuit according to a preferred embodiment of the present invention.

FIG. 3 is a circuit diagram showing the master fuse circuit 100 according to a preferred embodiment of the present invention. FIG. 4 is a circuit diagram showing the redundancy address storage and decoding circuit 200 according to a preferred embodiment of the present invention.

Referring first to FIG. 3, the master fuse 100 of the invention is formed of two P-channel metal oxide semiconductor (MOS) transistors 102 and 106, two N-channel MOS transistors 104 and 110, a master fuse MF, and two inverters 108 and 112. The PMOS transistor 102 has a current path formed between power supply voltage and one end of the master fuse MF, and a gate to which power-up signal PSET is applied. The NMOS transistor 104 has a current path formed between the other end of the master fuse MF and ground voltage, and a gate to which the power-up signal PSET is applied. The PMOS transistor 106 has a current path formed between the power supply voltage and node N1, and a gate coupled to burn-in test flag signal PBINB.

The power-up signal PSET maintains low level before the power supply voltage gets to a predetermined level, and becomes high level when the power supply voltage gets to, or exceeds the predetermined level. A burn-in test flag signal PBINB is provided from a known mode register set (MRS, not shown). The burn-in test flag signal PBINB is programmed to have low level for burn-in test mode, and high level for normal operation mode in accordance with a combination of address and external signal to set up a specific test mode. One example showing the MRS (mode register set) is disclosed in U.S. Pat. No. 5,973,988 entitled "Semiconductor Memory Device Having Circuit for Monitoring Set Value of Mode Register", incorporated by reference herein.

Continuing to refer to FIG. 3, the inverter 108 has an input terminal connected to the node ND1, and the inverter 112 has an input terminal connected to an output terminal of the inverter 108. The inverter 108 provides a first switch control signal. SCTN 1, and the inverter 112 provides a second switch control signal SCTN2. The first and second switch signals SCTN1 and SCTN2 are applied to the address storage and decoding circuit 200 which will be explained with reference to FIG. 4. The NMOS transistor 110 has a current path formed between the node ND1 and the ground voltage, and a gate coupled to the output terminal of the inverter 108. The inverter 108 and the NMOS transistor 110 form a latch circuit.

Referring to FIG. 4, the address storage and decoding circuit 200 includes plural fuses F1–F2, and F3–F4, and plural NMOS transistors 202–204, and 206–208 to which the fuses F1–F2, and F3–F4 are connected in series. The fuses F1–F2, and F3–F4 store block selection signals DRABLK to assign memory block having defective memory cell, and word line selection signals DRAWL to assign the defective memory cell. The NMOS transistors 202–204, and 206–208 are synchronously turned on/off in response to the first switch control signal SCTN1 provided from the master fuse circuit 100 shown in FIG. 3. The address storage and decoding circuit 200 includes PMOS transistors 210 and 212, NMOS transistors 214, 216, 218, and 220, NAND gates 222, and 226, and inverter 224.

The NMOS transistor 202 and the fuse F1 are connected between the word line selection signal DRAWL and a node ND2 in series, and the NMOS transistor 204 and the fuse F2 are connected between the signal DRAWL and the node ND2 in series. The NMOS transistor 206 and the fuse F3 are connected between the block selection signal DRABLK and the node ND2 in series, and the NMOS transistor 208 and the fuse F4 are connected between the signal DRABLK and the node ND2 in series. Gates of the NMOS transistors 202–204 and 206–208 are coupled to the first switch control signal SCTN1. The PMOS transistor 210 is connected between the node ND2 and the power supply voltage, and the PMOS transistor 212 is connected between a node ND3 and the power supply voltage. Gates of the PMOS transistors 210 and 212 are coupled to an output of the NAND gate 226. The NMOS transistors 214 and 218 are connected between the node ND2 and the ground voltage in series, and the NMOS transistors 216 and 220 are connected between the node ND3 and the ground voltage in series. Gates of the NMOS transistors 214 and 216 are coupled to the second switch control signals SCTN2. Gates of the NMOS transistors 218 and 220 are coupled to an output the NAND gate 226. The nodes ND2 and ND3 are connected to an input of the NAND gate 222, and the inverter 224 provides redundant flag signal PRENi in response to an output of the NAND gate 222.

The master fuse MF shown in FIG. 3 retains connected state before main memory cell of corresponding memory block is repaired, and cuts off when the main memory cell is repaired. A signal PRTR is programmed in the MRS to show which word line of normal or redundant word lines is selected. The signal PRTR is programmed to have low level when the normal word line is selected, and high level when the redundant word line is selected.

In the case that the master fuse MF is cut off, when the normal operation is carried out after the power-up, i.e. the signal PBINB retains high level, the first switch control signal SCTN1 becomes low level, while the second switch control signal SCTN2 becomes high level. If the control signal PRTR goes to high level, the address storage and decoding circuit 200 generates high-leveled redundant flag signal PRENi for the redundant word line corresponding to external row block address to be activated. Here, the normal word line becomes inactivated, which is well-known to those skilled in the art.

Examples of the foregoing operation are disclosed in U.S. Pat. No. 5,327,380 entitled "Method and Apparatus for Inhibiting a Predecoder When Selecting a Redundant Row Line", U.S. Pat. No. 5,355,339 entitled "Row Redundancy Circuit of a Semiconductor Memory Device", U.S. Pat. No. 6,067,268 entitled "Redundancy Fuse Box and Method for Arranging the Same", and U.S. Pat. No. 6,094,382 entitled "Integrated Circuit Memory Device with Improved Layout of Fuse Boxes and Buses", all of which are incorporated by reference herein.

When the burn-in test operation is carried out, or the signal PBINB becomes low level, the first switch control signal SCTN1 becomes high level, while the second switch control signal SCTN2 becomes low level. Thus, the NMOS transistors 202–204, and 206–208 are turned off, the NMOS transistors 214 and 216 are turned on. As a result, the signals DRAWL, and DRABLK are not provided to the address storage and decoding circuit 200. As the control signals PRTR is maintained as low level, the NAND gate 222 receives low level from the nodes ND1 and ND2. Thus, the redundant flag signal PRENi is inactivated for the normal word line corresponding to the external address to be activated.

According to the semiconductor memory device of the present invention, the time required for the burn-in test operation can be decreased by making a lot of word lines synchronously activated in order to give stress on many cells during the burn-in test operation. Further, the production yield can be improved by maximizing row redundancy flexibility to minimize an increase of chip size during the normal operation.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A semiconductor memory device having a plurality of main cells and a plurality of redundant cells, the device comprising:
    an address storage and decoding circuit for storing address information to assign a defective main cell of the main cells, and generating a redundant flag signal when the defective main cell corresponding to the stored address information is assigned by a current address information; and
    a master fuse circuit for generating switch control signals in accordance with a connected state of a master fuse storing whether the defective main cell is replaced with the redundant cell, and,
        wherein the master fuse circuit generates the switch control signals in response to a specific test signal indicating a specific test mode, wherein the switch control signals shut the address information off not to be provided to the address storage and decoding circuit regardless of the connected state of the master fuse.

2. The device of the claim 1, wherein the specific test signal is programmed in a mode register set to be activated on low level during a burn-in test operation, and to be inactivated on high level during a normal operation.

3. The device of the claim 2, wherein the master fuse circuit comprising:
    a first P-channel metal oxide semiconductor(MOS) transistor connected between power supply voltage and one end of the master fuse, and controlled by a power-up signal;
    a second PMOS transistor connected between the power supply voltage and the one end of the master fuse, and controlled by the burn-in test signal;
    a first N-channel MOS transistor connected between the other end of the master fuse and ground voltage, and controlled by the power-up signal;
    a first inverter having an input terminal connected to the other end of the master fuse, and an output terminal generating a first switch control signal of the switch control signals;
    a second NMOS transistor connected between the other end of the master fuse and the ground voltage, and controlled by the first switch control signal; and
    a second inverter generating a second switch control signal complementary to the first switch control signal in response to the output signal of the first inverter.

4. A method for performing burn-in test of a semiconductor device, the method comprising:
    providing a burn-in test signal;
    generating switch signals, in response to the burn-in test signal; and
    applying the switch signals to an address storage and decoding circuit, such that the address storage and decoding circuit is inactivated in response to the switch signals.

5. The method of claim 4, wherein the switch signals further comprise a first and second switch signals.

6. The method of claim 4, wherein the method further comprises providing a pointer signal PRTR and applying the PRTR signal with the switch signals to inactivate the address storage and decoding circuit.

7. The method of claim 6, wherein the PRTR signal is provided in a mode register set.

* * * * *

UNITED STATES PATENT AND TRADEMARK OFFICE
CERTIFICATE OF CORRECTION

PATENT NO.    : 6,400,620 B1
DATED         : June 4, 2002
INVENTOR(S)   : Yoo

It is certified that error appears in the above-identified patent and that said Letters Patent is hereby corrected as shown below:

Title page,
ABSTRACT,
Lines 8 and 9, "bum-in" should read -- burn-in --.

Column 1,
Lines 20, 21 and 38, "bum-in" should read -- burn-in --.

Column 3,
Lines 1-2, "practiced without the specific without the specific details." should read -- practiced without the specific details --.

Signed and Sealed this

Twenty-seventh Day of August, 2002

*Attest:*

JAMES E. ROGAN
*Director of the United States Patent and Trademark Office*

*Attesting Officer*